US008029903B2

(12) United States Patent (10) Patent No.: US 8,029,903 B2
Gotoh et al. (45) Date of Patent: Oct. 4, 2011

(54) SILICON NITRIDE SUBSTRATE, SILICON NITRIDE CIRCUIT BOARD UTILIZING THE SAME, AND USE THEREOF

(75) Inventors: Takeshi Gotoh, Omuta (JP); Motoharu Fukazawa, Omuta (JP); Tetsumi Ohtsuka, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 774 days.

(21) Appl. No.: 12/063,478

(22) PCT Filed: Jul. 27, 2006

(86) PCT No.: PCT/JP2006/314922
§ 371 (c)(1),
(2), (4) Date: Feb. 11, 2008

(87) PCT Pub. No.: WO2007/018050
PCT Pub. Date: Feb. 15, 2007

(65) Prior Publication Data
US 2009/0283307 A1 Nov. 19, 2009

(30) Foreign Application Priority Data
Aug. 11, 2005 (JP) ................................ 2005-232721

(51) Int. Cl.
*B32B 9/00* (2006.01)
*B32B 9/04* (2006.01)
*B32B 13/04* (2006.01)
*B32B 19/00* (2006.01)
(52) U.S. Cl. .................. 428/446; 428/450; 428/901
(58) Field of Classification Search .............. 501/97.2; 428/446, 688
See application file for complete search history.

(56) References Cited

U.S. PATENT DOCUMENTS 5,021,372 A * 6/1991 Pyzik et al. ............... 501/95.3
2006/0014625 A1 1/2006 Adams, Sr.

FOREIGN PATENT DOCUMENTS

| JP | 9 157054 | 6/1997 |
| JP | 2000 34172 | 2/2000 |
| JP | 2002 29849 | 1/2002 |
| JP | 2002 29851 | 1/2002 |

OTHER PUBLICATIONS

Machine English Translation of JP09-157054 to Toichi et al., provided by the JPO website, internet retrieval date of Dec. 9, 2010.*
Machine English Translation of JP2002-029851 to Kazuyuki et al., provided by the JPO website, internet retrieval date of Dec. 9, 2010.*
Extended European Search Report issued May 11, 2011, in Patent Application No. 06781833.6.
Thanakorn Wasanapiarnpong, et al., "Effect of post-sintering heat-treatment on thermal and mechanical properties of $Si_3N_4$ ceramics sintered with different additives", Journal of the European Ceramic Society, vol. 26, No. 15, XP 24960362, Jan. 1, 2006, pp. 3467-3475.
Thanakorn Wasanapiarnpong, et al., "Lower Temperature Pressureless Sintering of $Si_3N_4$ Ceramics using $SiO_2$-MgO-$Y_2O_3$ Additives without Packing Powder", Journal of the Ceramic Society of Japan, vol. 114, No. 9, XP 2634731, Sep. 1, 2006, pp. 733-738.
Sea-Hoon Lee, et al., "Effect of spray coated $SiO_2$ layers on the low temperature oxidation of $Si_3N_4$", Journal of the European Ceramic Society, vol. 23, No. 8, XP 4409235, Jul. 1, 2003, pp. 1199-1206.
Peter Greil, "Evaluation of Oxygen Content on Silicon Nitride Powder Surface from the Measurement of the Isoelectric Point", Journal of the European Ceramic Society, vol. 7, XP 2634732, Jan. 1, 1991, pp. 353-359.
Marcell Peuckert, et al., "Oxygen distribution in silicon nitride powders", Journal of Materials Science, vol. 22, XP 2634733, Jan. 1, 1987, pp. 3717-3720.
Do-Van Tuyen, et al., "Formation of rod-like $Si_3N_4$ grains in porous SRBSN bodies using $6Y_2O_3$-2MgO sintering additives", Ceramics International, vol. 35, No. 6, XP 26145936, Aug. 1, 2009, pp. 2305-2310.
R. Sangiorgi, et al., "Wettability of Hot-pressed Silicon Nitride Materials by Liquid Copper", Materials Science and Engineering A, vol. 103, No. 2, XP 26060539, Sep. 1, 1988, pp. 277-283.

* cited by examiner

*Primary Examiner* — Timothy Speer
*Assistant Examiner* — Jonathan Langman
(74) *Attorney, Agent, or Firm* — Oblon, Spivak, McClelland, Maier & Neustadt, L.L.P.

(57) ABSTRACT

Provided are a silicon nitride substrate and a silicon nitride circuit board with excellent electrical characteristics, and power control parts utilizing them.

A silicon nitride substrate comprises a silicon nitride sintered body obtainable by sintering a silicon nitride powder in the presence of a sintering aid comprising MgO, $Y_2O_3$ and $SiO_2$ in a proportion of (1) MgO/(MgO+$SiO_2$)=34-59 mol %, and (2) $Y_2O_3$/($Y_2O_3$+$SiO_2$)=50-66 mol %, and a silicon nitride circuit board utilizes it.

11 Claims, No Drawings

SILICON NITRIDE SUBSTRATE, SILICON NITRIDE CIRCUIT BOARD UTILIZING THE SAME, AND USE THEREOF

TECHNICAL FIELD

The present invention relates to a silicon nitride substrate, a silicon nitride circuit board utilizing it, and its use.

BACKGROUND ART

Heretofore, a circuit board has been one having an electrically conductive metal circuit joined to a main surface of a ceramic substrate on which a semiconductor is to be mounted by means of solder, and having a semiconductor device mounted at a predetermined position on the metal circuit. In order to maintain high reliability of a circuit board, it is required that heat generated from a semiconductor device should be dissipated so that the temperature of the semiconductor device will not become excessively high, and thus a ceramic substrate is required to have excellent heat dissipation properties in addition to electrical insulating properties.

In recent years, the circuit board has been miniaturized and a power module has been increasing its output, and under such circumstances, attention is being given to a silicon nitride (hereinafter, silicon nitride is referred to also as "SN") substrate employing an SN sintered body with excellent mechanical properties having high electrical insulating properties and high thermal conductivity and an SN circuit board having a metal circuit formed on a main surface of the SN substrate, in order to meet needs for a small light-weight module and for lead-free soldering which exerts a larger stress load on a ceramic sintered body than the conventional lead soldering.

Electrical characteristics of the circuit board include insulation resistance and withstand voltage as electrical insulating properties, and partial discharge characteristics occurring with application of a high voltage. Heretofore, the electrical insulating properties could be coped with by increasing the thickness of a substrate or by devising the shape of a metal circuit. With respect to the partial discharge characteristics, in order to solve the problems of an increase in the discharge amount occurring with application of the high voltage and discharge from a surface portion of the metal circuit, it is proposed to set a side drop of a joining layer relatively long (Patent Document 1) and to specify a curvature radius at corners of the metal circuit (Patent Document 2).

However, these proposals relate to formation of the circuit and it is the present state that no sufficient study has been made on improvement in the electrical characteristics of the substrate per se.
(Patent Documents 1 and 2).
   Patent Document 1: JP-A-10-190176
   Patent Document 2: JP-A-10-214915

DISCLOSURE OF THE INVENTION

Object to be Accomplished by the Invention

Under the above-mentioned circumstances, it is an object of the present invention to provide an SN substrate with excellent electrical characteristics and a circuit board utilizing it.

Means to Accomplish the Object

The inventor of the present invention conducted intensive and extensive studies in order to produce an SN substrate with excellent electrical characteristics. As a result, the present inventor found that it was possible to reduce a corrosion amount of a grain boundary phase of the SN substrate, occurring in an etching treatment and a plating treatment carried out for formation of a circuit pattern, by specifying a composition of a sintering aid used in production of the SN sintered body. The present inventor further found that the decrease in the corrosion amount of the grain boundary phase of the SN substrate resulted in decrease in surface roughness of a creepage surface of the circuit, and an effective thickness of the SN substrate became thicker, so as to improve the electrical characteristics such as the insulation resistance, partial discharge inception voltage and withstand voltage of the circuit board.

The present invention is based on the above-mentioned novel findings and has the following gists.

1. A silicon nitride substrate comprising a silicon nitride sintered body obtainable by sintering a silicon nitride powder in the presence of a sintering aid comprising MgO, $Y_2O_3$ and $SiO_2$ in a proportion of (1) $MgO/(MgO+SiO_2)=34\text{-}59$ mol % and (2) $Y_2O_3/(Y_2O_3+SiO_2)=50\text{-}66$ mol %.

2. The silicon nitride substrate according to the above 1, wherein the silicon nitride powder has an average particle size (D50) of from 0.6 to 0.8 µm.

3. The silicon nitride substrate according to the above 1 or 2, wherein an amount of oxygen contained in the silicon nitride powder is at most 2 mass %.

4. The silicon nitride substrate according to any one of the above 1 to 3, wherein the sintering aid is used in an amount of from 5 to 15 parts by mass based on 100 parts by mass of the silicon nitride powder.

5. The silicon nitride substrate according to any one of the above 1 to 4, comprising the silicon nitride sintered body obtainable by sintering the silicon nitride powder in the presence of an organic binder together with the sintering aid.

6. A silicon nitride circuit board obtained by joining a metal plate to at least one main surface of the silicon nitride substrate as defined in any one of the above 1 to 5 and then forming a circuit pattern.

7. The silicon nitride circuit board according to the above 6, wherein a corrosion amount of a grain boundary phase of the silicon nitride substrate is at most 5 µm after an etching treatment and, a plating treatment optionally conducted.

8. The silicon nitride circuit board according to the above 6 or 7, wherein a partial discharge inception voltage is at least 6.5 kV when a thickness of the silicon nitride substrate is 0.32 mm.

9. The silicon nitride circuit board according to any one of the above 6 to 8, wherein a dielectric breakdown voltage is at least 7.5 kV when a thickness of the silicon nitride substrate is 0.32 mm.

10. A module employing the silicon nitride circuit board as defined in any one of the above 6 to 9.

Effects of the Invention

The present invention provides a silicon nitride substrate with a considerably small corrosion amount after an etching treatment and an optional plating treatment, and, in turn, provides a silicon nitride circuit board with excellent electrical characteristics, a high partial discharge inception voltage and dielectric breakdown voltage, and a module utilizing the circuit board.

BEST MODE FOR CARRYING OUT THE INVENTION

The SN powder, which is a main raw material for the silicon nitride substrate of the present invention, may be one of powders produced by known methods such as a direct nitriding method, a silica reduction method and an imide pyrolysis method. An amount of oxygen in the SN powder is preferably at most 2 mass % and more preferably at most 1.5 mass %. With respect to particle sizes, the SN powder preferably has an average particle size (D50 value), for example measured by microtrack SPA (manufactured by Leeds & Northrup Company), of from 0.6 to 0.8 μm and particularly preferably has that of from 0.65 to 0.75 μm. Furthermore, the SN powder preferably has a D90 value of from 1.5 to 3.0 μm and a D100 value of at most 8.0 μm. The SN powder preferably has a specific surface area of from 10 to 15 $m^2/g$ and particularly preferably has that of from 12 to 13 $m^2/g$. If the average particle size or specific surface area of the SN powder is outside the above range, the SN sintered body might not be densified or the mechanical strength of the SN sintered body might decrease.

Examples of major impurities in the SN powder of the present invention include Fe, Al, Ca, C and oxygen. Amounts of the unavoidable impurities derived from industrial raw materials are about 600 μg of Fe, 700 μg of Al, 200 μg of Ca and 3000 μg of C, per 1 g of the SN power. The oxygen contained in the SN powder is derived from $SiO_2$ and the unavoidable impurities containing oxygen, and the content thereof preferably falls within the above-mentioned range.

The SN powder is fired in the presence of a sintering aid and the sintering aid is comprised of MgO, $Y_2O_3$ and $SiO_2$, a proportion of which needs to be in the range of (1) $MgO/(MgO+SiO_2)$=34-59 mol % and (2) $Y_2O_3/(Y_2O_3+SiO_2)$=50-66 mol %. If the proportion of the sintering aid $MgO/(MgO+SiO_2)$ is less than 34 mol %, the densification of the SN sintered body might be insufficient, so as to decrease the thermal conductivity or deflective strength. On the other hand, if $MgO/(MgO+SiO_2)$ exceeds 59 mol %, MgO—$SiO_2$ eutectic crystals will be produced in a larger amount, whereby the corrosion amount of the SN substrate might be larger in the etching treatment and plating treatment. Furthermore, if $Y_2O_3/(Y_2O_3+SiO_2)$ is less than 50 mol %, $Y_2O_3$ with which $SiO_2$ makes a eutectic crystal will become insufficient and excessive $SiO_2$ will be separated out and easily dissolve in the etching treatment and plating treatment, whereby the corrosion amount of the sintering aid in the SN substrate might become larger. On the other hand, if $Y_2O_3/(Y_2O_3+SiO_2)$ exceeds 66 mol %, $Y_2O_3$ excessively exists in the SN substrate, whereby the thermal conductivity or deflective strength might decrease.

Among others, the proportion is preferably determined to be (1) $MgO/(MgO+SiO_2)$=38-55 mol % and (2) $Y_2O_3/(Y_2O_3+SiO_2)$=54-62 mol %.

An amount of the sintering aid used is preferably from 5 to 15 mass % and particularly preferably from 7 to 13 mass %, based on 100 parts by mass of the SN powder. If the amount used is less than 5 parts by mass, no dense SN sintered body might be obtained, while if it exceeds 15 parts by mass, the ratio of the grain boundary phase in the sintered body tends to increase, whereby the thermal conductivity of the SN substrate might decrease.

The SN powder and sintering aid are mixed and fired to produce the SN substrate of the present invention. In this case, an organic binder, a solvent, a plasticizer, etc. can be appropriately used, if necessary, as long as the properties of the SN substrate of the present invention are not affected.

There are no particular restrictions on a method of mixing the SN powder, the sintering aid, and the organic binder, plasticizer and solvent used if necessary, and one of known methods such as a universal mixer, an automatic mortar, a mixer, a vibrating sieve, a ball mill and a rod mill may be used.

All the raw materials may be mixed at once or it is possible to mix a part of raw materials, e.g., the organic binder, plasticizer and solvent first, and then to add and mix the SN powder and sintering aid. Furthermore, the raw material powders mixed may be molded as they are, or may be granulated once and then molded in order to increase the molding density. There are no particular restrictions on a method of the molding in the present invention and one of known molding methods such as a doctor blade method, extrusion, dry pressing, injection molding and a slip cast method may be used.

There are no particular restrictions on the above-mentioned organic binder in the present invention and one of known materials can be used. A type of the organic binder may be a methylcellulose type, an acryl type or the like, and an organic binder may be used singly or a plurality of organic binders may be used in combination. An amount of the organic binder used is preferably from 0.1 to 15 parts by mass and particularly preferably from 5 to 10 parts by mass, based on 100 parts by mass of the SN powder. When the organic binder is used in a liquid state, a solid content of the organic binder is adjusted to the above-mentioned range. If the amount of the organic binder used is less than 0.1 part by mass, a molded product will fail to have sufficient strength, whereby cracking might occur. On the other hand, if the amount exceeds 15 parts by mass, dimensional failure or deformation might occur due to decrease in the density of the molded product in removal of the binder in a debindering step, to increase a shrinkage rate in the firing step.

There are no particular restrictions on the plasticizer used in the present invention and one of known plasticizers may be used. Specific examples of the plasticizer include refined glycerol, glycerin triolate, diethylene glycol, and so on. An amount of the plasticizer used is preferably from 0.1 to 5 parts by mass, particularly preferably from 1 to 3 parts by mass, based on 100 parts by mass of the SN powder. If the amount used is less than 0.1 part by mass, a molded sheet will fail to have sufficient flexibility, whereby the molded product becomes brittle in a press-molding and the sheet tends to crack easily. On the other hand, if the amount exceeds 5 parts by mass, it will be difficult to retain the sheet shape, so that thickness unevenness can occur in the sheet width direction.

Furthermore, in a case where a solvent is used in the present invention, a type of the solvent may be ethanol, toluene, or the like, and it is also possible to use deionized water or pure water, considering the global environment and explosion-proof facilities. An amount of the solvent used is preferably from 15 to 20 parts by mass, particularly preferably from 16 to 19 parts by mass, based on 100 parts by mass of the SN powder. If the amount is less than 15 parts by mass, it might be difficult to form a sheet; on the other hand, if the amount exceeds 20 parts by mass, it will be difficult to retain the sheet shape, so that thickness unevenness can occur in the sheet width direction.

For debindering the molded product, the molded product is heated in a stream of nitrogen gas, air, or the like, preferably at from 350 to 450° C., preferably for from 3 to 15 hours to remove the organic binder. A carbon residue in the molded product after the debindering treatment by heating is preferably at most 2.0 mass %. If the carbon residue exceeds 2.0 mass %, sintering will be inhibited, and no dense sintered body might be obtained.

The molded product debindered is preferably fired at a temperature of from 1600 to 1900° C. under a pressure of at least 0.6 MPa in an atmosphere of a non-oxidizing gas such as nitrogen or argon. If the increased pressure is less than 0.6 MPa, the SN will decompose in the firing and no sintered body might be obtained. If the firing temperature is less than 1600° C., the firing will become insufficient and the density of the sintered body will not increase, so that the thermal conductivity and deflective strength might be insufficient. On the other hand, if the firing temperature exceeds 1900° C., the sintering aid will scatter in a firing furnace, whereby the content of the sintering aid will depart from the range of the present invention and densification might be difficult. A firing period is preferably as short as possible. Namely, in the temperature region in which the density of the sintered body becomes at least 98%, the firing period is preferably within 10 hours and more preferably within 5 hours.

The thickness of the SN substrate in the present invention differs depending on intended use, and is preferably in the range of from about 0.2 to 1 mm in general.

A metal plate to be jointed to the SN substrate in the present invention may be copper, aluminum, tungsten, molybdenum or an alloy containing any one of them, and copper, aluminum or an alloy thereof is generally used. There are no particular restrictions on the thickness of the metal plate, and the thickness is appropriately determined depending on an electric current flowing. In general, it is common to use the metal plate in the thickness of from 0.1 to 1 mm.

A method for joining the SN substrate to the metal plate may be either a DBC method or an active metal solder method. A solder used in the active metal solder method is composed of silver and copper as main components, and an active metal as an accessory component. Specific examples of the active metals include titanium, zirconium, hafnium, niobium, tantalum, vanadium and compounds thereof. A ratio of the metal components in the solder is, for example, from 1 to 10 parts by mass of the active metal based on a total of 100 parts by mass of the main components, in which silver is from 80 to 97 parts by mass and copper is from 20 to 3 parts by mass.

The solder may be used in the form of foil or powder, but is preferably used in the form of a paste. The paste can be prepared by adding an organic solvent and, if necessary, an organic binder to the metal components of the solder and mixing them by means of one of known mixing apparatus such as rolls, a kneader, a universal mixer and an automatic mortar. The organic solvent used may be one of methyl cellosolve, terpineol, isophorone, toluene, and so on and the organic binder may be one of ethyl cellulose, methyl cellulose, polymethacrylate and so on.

A coating amount of the solder is preferably from 4 to 20 mg/cm$^2$, particularly preferably from 5 to 15 mg/cm$^2$ on the dry basis. If the coating amount is less than 4 mg/cm$^2$, an unreacted portion might appear; on the other hand, if the coating amount exceeds 20 mg/cm$^2$, the solder will ooze and corrode the metal plate in the joining step, whereby the quality might be adversely affected. There are no particular restrictions on a coating method and one of known coating methods such as a screen printing method and a roll coater method can be applied.

In the active metal solder method, the solder is interposed between the SN substrate and the metal plate, and they are heated and cooled in vacuum to produce a joined body. The solder may be applied or placed onto either the SN substrate or the metal plate. When an alloy foil is used, the metal plate can be preliminarily clad by the alloy foil. A heating condition is appropriately determined depending on the solder used. For example, when the composition of the solder is 5 parts by mass of zirconium based on a total of 100 parts by mass of 90 parts by mass of silver and 10 parts by mass of copper, the joining is carried out under such conditions that the temperature is preferably from 830 to 860° C., the period is preferably from 30 to 60 minutes and the degree of vacuum is preferably from $1\times10^{-10}$ to $5\times10^{-5}$ Pa.

In order to form a metal circuit on the joined body of the SN substrate and the metal plate, an etching resist is applied onto a surface of the metal and an etching treatment is carried out. There are no particular restrictions on a method for carrying out the etching on the metal plate in a circuit pattern, and a common method is such that the circuit pattern is drawn with the etching resist on the metal plate and the etching is carried out. The etching resist can be removed by one of known methods. The etching resist used may be one of known resists of a UV curable type or a thermal curable type. Moreover, an appropriate etchant is selected and used depending on the type of the metal plate used. For example, when the metal plate is copper, the etchant used is a solution such as a ferric chloride solution, a cupric chloride solution, sulfuric acid or a hydrogen peroxide solution, and the ferric chloride or cupric chloride solution is preferably used.

There remain the applied solder, an alloy layer thereof, a nitride layer and the solder running over the metal circuit pattern and being unnecessary for the circuit formation, between metal circuits on the circuit board from which unnecessary metal portions were removed by the etching, and it is, therefore preferable to remove the unnecessary solders with an ammonium halide solution such as NH$_4$F in a first treatment and with a solution containing an inorganic acid such as sulfuric acid or nitric acid and a hydrogen peroxide solution in a second treatment. A concentration of the inorganic acid is usually from 2 to 4 mass % and a concentration of hydrogen peroxide is usually from 0.5 to 1 mass %. Thereafter, all the etching resist is removed with an alkaline solution.

According to the present invention, the circuit can be subjected to a plating treatment such as nickel plating, if necessary. In this case, there are no particular restrictions on a plating resist and a solvent dry type ink, a UV curable type ink, or the like may be used. There are no particular restrictions on a coating method, and one of known coating methods such as screen printing and a roll coater method may be applied. The coating is carried out so that the coating thickness is preferably from 0.005 to 0.07 mm after dried. If the thickness is less than 0.005 mm, the metal might be partially exposed or if the thickness exceeds 0.07 mm, removal of the plating resist will take a long time to decrease productivity.

There are no particular restrictions on the plating treatment and electroless nickel plating, electroless nickel-gold plating or solder plating is preferably applied from the viewpoints of workability, cost, and the like. There are no particular restrictions on the thickness of the plated layer and it is preferably from 2 to 8 μm. If the plating thickness is less than 2 μm, mounting properties such as solder wettability and wire bonding properties might be adversely affected. On the other hand, if the plating thickness exceeds 8 μm, the substrate characteristics might be adversely affected by peeling of the plated film or the like.

There are no particular restrictions on a method for removing the plating resist and examples of the method include a removing method with an organic solvent such as ethanol or toluene and a removing method with an alkaline aqueous solution.

The circuit board prepared as described above is joined to a base plate and an electronic component such as a semiconductor device by means of a solder. There are no particular restrictions on a type of the solder, and a lead-free solder can be applied as well as a tin-lead eutectic solder commonly used. There are no particular restrictions on a type of the lead-free solder and one of known compositions may be used, e.g., the Sn—Ag—Cu type, Sn—Cu type, Sn—Zn type, Sn—Bi type, Sn—Ag type, Sn—Ag—Cu—Bi type, Sn—Ag—In—Bi type and Sn—Sb type. There are no particular restrictions on a soldering method and, for example, an applicable method is such that a solder paste is applied onto predetermined portions by screen printing, or the like, a component or the like is mounted, and they are placed in a furnace at a predetermined temperature at which the solder melts, to effect soldering. It is preferred to keep the solder out of contact with side surfaces of the metal plate, from the viewpoint of reliability of the circuit board.

In order to improve the electrical characteristics of the SN circuit board according to the present invention, it is necessary to prevent progress of corrosion into the grain boundary phase of the SN substrate during the etching treatment and the optional plating treatment. This is because the grain boundary phase of the SN substrate composed essentially of the sintering aid tends to be easily removed by the etchant or the plating solution during the etching treatment and the plating treatment. When the grain boundary phase is corroded as described above, the effective thickness of the substrate becomes thinner and the surface roughness on the creepage surface of the circuit increases, so as to degrade the electrical characteristics of the SN circuit board considerably.

The corrosion amount of the grain boundary phase of the SN substrate is evaluated as follows: the SN substrate is perpendicularly cut in the thickness direction and the cut surface is polished into a smooth surface, followed by measurement from a reflected electron image with a field emission scanning electron microscopy (hereinafter referred to as "COMPO image"). A portion to be observed and evaluated is an edge region of the SN circuit board which is not joined with the metal plate and which is always exposed to the etchant or the plating solution in the polished surface. No grain boundary phase is observed in a corroded portion while the grain boundary phase is observed as a white portion in the COMPO image. A distance from the outermost surface of the SN substrate to the perpendicularly deepest portion of the grain boundary phase eroded is measured as the corrosion amount of the grain boundary phase of the SN substrate. According to the present invention, the corrosion amount of the grain boundary phase achieved is preferably at most 5 μm, and particularly preferably at most 2.5 μm.

In the present invention, as described above, the sufficient effective thickness of the substrate is ensured and the surface roughness of the creepage surface of the circuit is reduced, thereby obtaining the SN circuit board with excellent electrical characteristics of the insulation resistance, partial discharge inception voltage, withstand voltage and so on.

For example, in the case where the thickness of the SN substrate is 0.32 mm, the present invention preferably attains the partial discharge inception voltage of at least 6.5 kV, particularly preferably at least 7.0 kV, and preferably attains the withstand voltage of at least 7.5 kV and particularly preferably at least 8.0 kV.

Now, the present invention will be explained in further detail with reference to examples, but it should be understood that the present invention is not limited to the following Examples without departing from the scope of the invention.

EXAMPLES

Example 1

3 parts by mass of oleic acid was added as a surface treatment agent to 100 parts by mass of an SN powder in order to avoid hydrolysis of SN particles, and they were mixed with a mixer for two minutes to preliminarily conduct a surface treatment of the SN powder. After the surface treatment, 10 parts by mass of an organic binder and a total of 10 parts by mass of a sintering aid (in a proportion of $Y_2O_3$, MgO and $SiO_2$ as shown in Table 1) were mixed with 100 parts by mass of the SN powder with a Bolton mixer.

The powder mixture was charged into a mixer and a solution mixture composed of 3 parts by mass of a plasticizer and 18 parts by mass of deionized water based on 100 parts by mass of the SN powder was sprayed to the mixture under stirring, with compressed air (0.2 MPa) for uniformly dispersing/spraying the solution mixture, to prepare a granular wet powder material.

<Materials Used>

SN powder: Manufactured by Denki Kagaku Kogyo Kabushiki Kaisha, trade name "DENKA SILICON NITRIDE" grade name "NP-200" (α-rate 91%, D50 value 0.7 μm, D90 value 2.0 μm, D100 value 4.6 μm, specific surface area 12 $m^2$/g, oxygen amount 1.5 mass %).

$Y_2O_3$: Manufactured by Shin-Etsu Chemical Co., Ltd., trade name "Yttrium Oxide," D50 particle size of powder 1.0 μm.

MgO: Manufactured by Iwatani Chemical Company, trade name "MTK-30," D50 particle size of powder 0.2 μm, specific surface area 160 $m^2$/g.

$SiO_2$: Manufactured by Denki Kagaku Kogyo Kabushiki Kaisha, DENKA FUSED SILICA "SFP-30M," D50 particle size of powder 0.72 μm, specific surface area 6.2 $m^2$/g.

Organic binder: Hydroxypropylmethyl cellulose. Manufactured by Shin-Etsu Chemical Co., Ltd., trade name "METOLOSE 65SH."

Plasticizer: Manufactured by Kao Corporation, trade name "EXCEPARL," main component glycerol.

(Preparation of SN Substrate)

Then, a sheet was formed in the size of depth 60 mm×width 50 mm×thickness 0.4 mm by a kneading extruder. The sheet was dried by a belt drier maintained at 100° C. until the moisture content thereof became 2 mass %. Thereafter, the sheet was put in a container made of boron nitride and held at normal pressure and at 400° C. in the atmosphere for 4 hours to effect debindering. Then the sheet was sintered at 1800° C. in a pressurized nitrogen atmosphere of 0.8 MPa for 4 hours with a carbon heater electric furnace to prepare an SN substrate in the thickness of 0.32 mm.

<Preparation of SN Circuit Board>

In order to evaluate the performance as a circuit board, copper plates were used as a metal circuit and a metal heatsink, and joining and formation of a circuit pattern were conducted by the following method.

30 Parts by mass of terpineol was added in 100 parts by mass of a powder mixture composed of 85 mass % of Ag, 10 mass % of Cu, 2 mass % of Zr and 3 mass % of TiH to prepare a paste liquid mixture, and this liquid mixture was applied onto both sides of the SN sintered body with a screen printer so that a coating amount became 5 mg/$cm^2$ on the dry basis. Then, an oxygen-free copper plates in 2.5 inches×2 inches× thickness 0.01 inch was bonded to each side. Fourteen bodies were prepared each in the structure of the SN sintered body with the oxygen-free copper plates on respective sides, were stacked and set on a carbon jig with carbon screws, and were held at 850° C. for 45 minutes, thereby preparing a joined body of the SN sintered body and the copper plates.

Screen printing was carried out with a UV curable resist ink so as to form a circuit pattern in a desired shape on one main surface of the aforementioned joined body and a heatsink pattern on the other main surface, followed by irradiation with a UV lamp to cure the resist film. Then, portions other than the screen-printed portion were etched with a cupric chloride solution and the resist was removed with an ammonium fluoride aqueous solution to prepare an SN substrate with a copper circuit. The SN circuit board thus prepared was evaluated by measurements of the partial discharge inception voltage, dielectric breakdown and corrosion amount. Table 1 shows the results.

<Materials Used>

Oxygen-free copper plate: Oxygen-free copper plate (JIS H 3100) manufactured by Sumitomo Metal Mining Blass & Copper Co., Ltd.

UV curable resist ink: "PER-27B-6" manufactured by GOO CHEMICAL CO., LTD.

<Measuring Methods>

Partial discharge inception voltage:

The prepared circuit board was immersed in an insulating oil ("Fluorinert FC-77" manufactured by Sumitomo 3M Limited) and while the voltage was applied at a rate of 1 kV/min, the voltage at the partial discharge amount of 10 pC was taken as the partial discharge inception voltage (average value of n=5).

Dielectric breakdown test:

A voltage was applied up to the maximum of DC 10 kV to the circuit side and to the heatsink side to measure the dielectric breakdown voltage.

Measurement for corrosion amount of grain boundary phase of SN substrate:

The SN substrate was perpendicularly cut in the thickness direction and the cut surface was polished into a smooth surface with #2000 waterproof sandpaper; an edge region of the SN circuit board not joined with the metal plate was observed with a field emission scanning electron microscopy. From the obtained COMPO image, a distance from the outermost surface of the SN substrate to the perpendicularly deepest portion of the grain boundary phase was measured as the corrosion amount of the grain boundary phase corroded by the etchant or the plating solution (average value of n=10).

Examples 2 to 6 and Comparative Examples 1 to 4

The same operation as in Example 1 was carried out except that the proportion of $Y_2O_3$, MgO and $SiO_2$ was changed to those as shown in Table 1. Table 1 shows the results.

Examples 7 to 10

The same operation as in Example 1 was carried out except that a total amount of $Y_2O_3$, MgO and $SiO_2$ was changed to those as shown in Table 1. Table 1 shows the results It is clear from the Examples of the present invention that the dielectric breakdown voltage and partial discharge inception voltage are improved by decrease in the corrosion amount of the SN sintered body, whereby the SN circuit board with high reliability is obtained.

INDUSTRIAL APPLICABILITY

Since the SN substrate and the SN circuit board of the present invention have the high electric insulation properties, high thermal conductivity and excellent mechanical properties, they are widely applicable, e.g., as a compact lightweight module, a high output power module, and the like.

The entire disclosure of Japanese Patent Application No. 2005-23272 filed on Aug. 11, 2005 including the specification, claims, drawings and summary is incorporated herein by reference in its entirety.

The invention claimed is:

1. A silicon nitride substrate comprising a silicon nitride sintered body obtained by sintering a silicon nitride powder in the presence of a sintering aid comprising MgO, $Y_2O_3$ and $SiO_2$ in a proportion of (1) MgO/(MgO+$SiO_2$)=34-59 mol % and (2) $Y_2O_3$/($Y_2O_3$+$SiO_2$)=50-66 mol %, wherein an amount of oxygen present in the silicon nitride powder is at least 1.5 mass % and at most 2 mass %.

2. The silicon nitride substrate according to claim 1, wherein the silicon nitride powder has an average particle size (D50) of from 0.6 to 0.8 μm.

TABLE 1

| | Sintering aid | | Substrate characteristics | | Electrical characteristics of circuit board | | | |
|---|---|---|---|---|---|---|---|---|
| Experiment No. | Amount added* (parts by mass) | MgO/ (MgO + $SiO_2$) (mol %) | $Y_2O_3$/ ($Y_2O_3$ + $SiO_2$) (mol %) | Deflective strength (MPa) | Thermal conductivity (W/mK) | Partial discharge inception voltage (kV) | Dielectric breakdown voltage (kV) | Corrosion amount (μm) | Note |
| 1 | 10 | 50 | 60 | 720 | 90 | 7.0 | 8.0 | 2.5 | Ex. 1 |
| 2 | 10 | 40 | 60 | 730 | 86 | 6.9 | 7.9 | 2.0 | Ex. 2 |
| 3 | 10 | 34 | 60 | 740 | 84 | 7.1 | 8.1 | 1.0 | Ex. 3 |
| 4 | 10 | 59 | 60 | 750 | 88 | 6.8 | 7.8 | 4.5 | Ex. 4 |
| 5 | 10 | 50 | 50 | 720 | 86 | 7.0 | 8.0 | 2.5 | Ex. 5 |
| 6 | 10 | 50 | 66 | 730 | 84 | 7.1 | 8.1 | 2.5 | Ex. 6 |
| 7 | 5 | 50 | 60 | 720 | 82 | 7.0 | 8.0 | 2.5 | Ex. 7 |
| 8 | 15 | 50 | 60 | 720 | 82 | 6.7 | 7.8 | 4.5 | Ex. 8 |
| 9 | 10 | 32 | 60 | 440 | 55 | 4.3 | 5.9 | 7.0 | Comp. Ex. 1 |
| 10 | 10 | 62 | 60 | 740 | 55 | 4.0 | 4.9 | 15.0 | Comp. Ex. 2 |
| 11 | 10 | 50 | 48 | 720 | 83 | 3.9 | 5.2 | 8.5 | Comp. Ex. 3 |
| 12 | 10 | 50 | 68 | 720 | 60 | 4.2 | 5.1 | 8.5 | Comp. Ex. 4 |
| 13 | 3 | 50 | 60 | 460 | 62 | 4.5 | 6.2 | 6.0 | Ex. 9 |
| 14 | 17 | 50 | 60 | 720 | 60 | 4.5 | 6.5 | 6.5 | Ex. 10 |

*An amount added relative to 100 parts by mass of the SN powder

3. The silicon nitride substrate according to claim 1, wherein the sintering aid is used in an amount of from 5 to 15 parts by mass based on 100 parts by mass of the silicon nitride powder.

4. The silicon nitride substrate according to claim 1, comprising the silicon nitride sintered body obtainable by sintering the silicon nitride powder in the presence of an organic binder together with the sintering aid.

5. A silicon nitride circuit board obtained by joining a metal plate to at least one main surface of the silicon nitride substrate as defined in claim 1 and then forming a circuit pattern.

6. The silicon nitride circuit board according to claim 5, wherein a corrosion amount of a grain boundary phase of the silicon nitride substrate is at most 5 μm after an etching treatment and, a plating treatment optionally conducted.

7. The silicon nitride circuit board according to claim 5, wherein a partial discharge inception voltage is at least 6.5 kV when a thickness of the silicon nitride substrate is 0.32 mm.

8. The silicon nitride circuit board according to claim 5, wherein a dielectric breakdown voltage is at least 7.5 kV when a thickness of the silicon nitride substrate is 0.32 mm.

9. A module employing the silicon nitride circuit board as defined in claim 5.

10. The silicon nitride substrate according to claim 1, wherein the sintering aid comprises MgO, $Y_2O_3$ and $SiO_2$ in a proportion of (1) $MgO/(MgO+SiO_2)$=34-59 mol % and (2) $Y_2O_3/(Y_2O_3+SiO_2)$=60-66 mol %.

11. The silicon nitride substrate according to claim 1, wherein the sintering aid comprises MgO, $Y_2O_3$ and $SiO_2$ in a proportion of (1) $MgO/(MgO+SiO_2)$=38-55 mol % and (2) $Y_2O_3/(Y_2O_3+SiO_2)$=54-62 mol %.

* * * * *